(12) United States Patent
Guan et al.

(10) Patent No.: US 8,975,720 B2
(45) Date of Patent: Mar. 10, 2015

(54) CORNER LAYOUT FOR SUPERJUNCTION DEVICE

(71) Applicants: Lingpeng Guan, Sunnyvale, CA (US); Madhur Bobde, San Jose, CA (US)

(72) Inventors: Lingpeng Guan, Sunnyvale, CA (US); Anup Bhalla, Santa Clara, CA (US); Tinggang Zhu, Cupertino, CA (US); Madhur Bobde, San Jose, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 13/923,065

(22) Filed: Jun. 20, 2013

(65) Prior Publication Data

US 2013/0277740 A1    Oct. 24, 2013

Related U.S. Application Data

(62) Division of application No. 12/709,114, filed on Feb. 19, 2010, now Pat. No. 8,476,698.

(51) Int. Cl.
| | |
|---|---|
| *H01L 29/72* | (2006.01) |
| *H01L 29/78* | (2006.01) |
| *H01L 29/06* | (2006.01) |
| *H01L 29/10* | (2006.01) |
| *H01L 29/40* | (2006.01) |
| *H01L 29/47* | (2006.01) |

(52) U.S. Cl.
CPC ........ *H01L 29/7823* (2013.01); *H01L 29/0634* (2013.01); *H01L 29/0696* (2013.01); *H01L 29/7811* (2013.01); *H01L 29/0638* (2013.01); *H01L 29/1095* (2013.01); *H01L 29/402* (2013.01); *H01L 29/404* (2013.01); *H01L 29/47* (2013.01)
USPC ............ 257/483; 257/342; 257/401; 257/484

(58) Field of Classification Search
USPC .................................. 257/342, 401, 483, 484
See application file for complete search history.

(56) References Cited

U.S. PATENT DOCUMENTS

| | | | |
|---|---|---|---|
| 8,476,698 B2 | 7/2013 | Guan et al. | |
| 2006/0118900 A1 | 6/2006 | Zeghbroeck | |
| 2007/0001230 A1 | 1/2007 | Lee et al. | |
| 2007/0145514 A1 | 6/2007 | Kocon | |
| 2010/0163972 A1 | 7/2010 | Saggio et al. | |
| 2011/0042742 A1* | 2/2011 | Bhalla et al. | 257/334 |
| 2012/0161274 A1 | 6/2012 | Lee et al. | |

OTHER PUBLICATIONS

Non Final Office Action for U.S. Appl. No. 12/709,114 dated Feb. 8, 2012.
Non Final Office Action for U.S. Appl. No. 12/709,114 dated Jul. 16, 2012.
Onishi, Y.; Iwamoto, S.; Sato, T.; Nagaoka, T.; Ueno, K.; Fujihira, T., "24 m.OMEGA.cm2 680 V silicon superjunction MOSFET", Proceedings of the 14th International Symposium on Power Semiconductor Devices and ICs, 2002, pp. 241-244. cited by applicant.
Taiwanese Office Action for TW Application No. 100104932, dated Jun. 28, 2013.

* cited by examiner

*Primary Examiner* — Edward Wojciechowicz
(74) *Attorney, Agent, or Firm* — Joshua D. Isenberg; JDI Patent

(57) ABSTRACT

A superjunction device and methods for layout design and fabrication of a superjunction device are disclosed. A layout of active cell column structures can be configured so that a charge due to first conductivity type dopants balances out charge due to second conductivity type dopants in a doped layer in an active cell region. A layout of end portions of the active cell column structures proximate termination column structures can be configured so that a charge due to the first conductivity type dopants in the end portions and a charge due to the first conductivity type dopants in the termination column structures balances out charge due to the second conductivity type dopants in a portion of the doped layer between the termination column structures and the end portions.

4 Claims, 8 Drawing Sheets

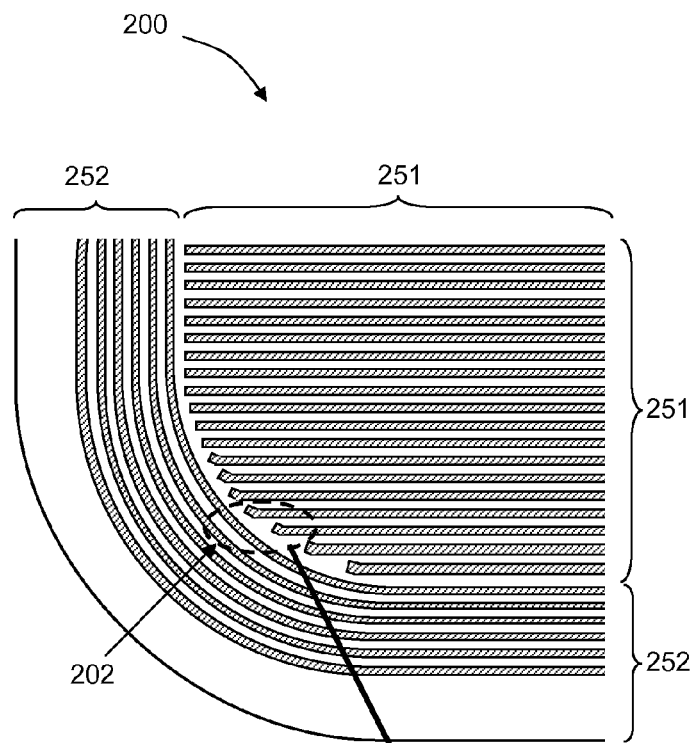
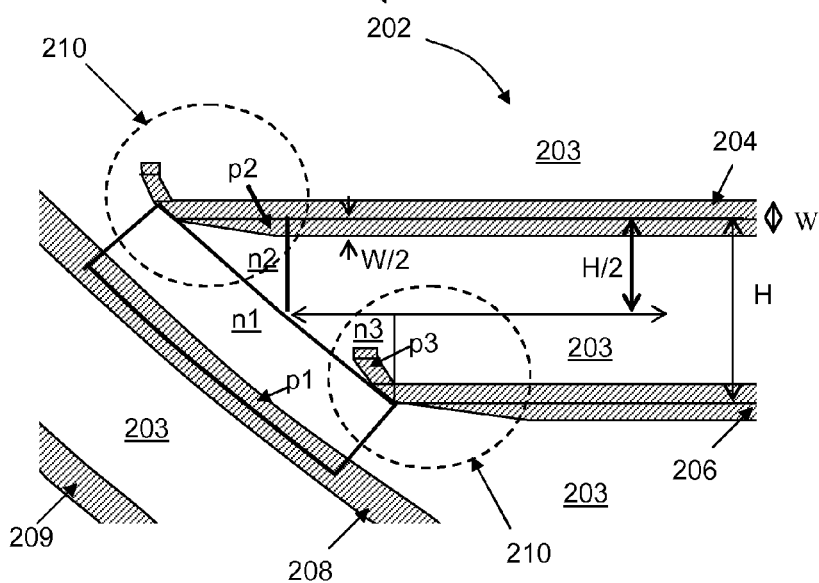
FIG. 2A
FIG. 2B

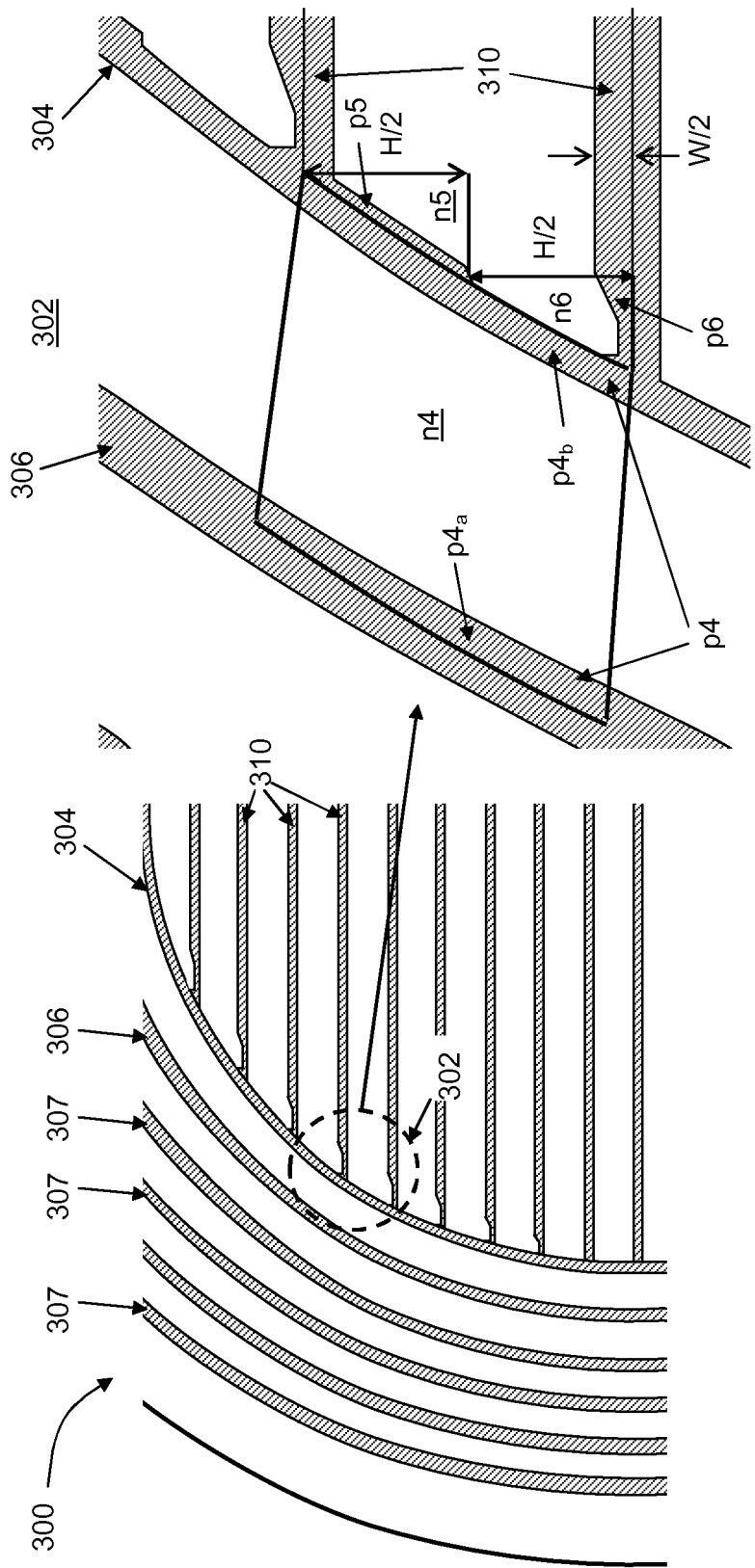

CORNER LAYOUT FOR SUPERJUNCTION DEVICE

PRIORITY CLAIM

This application is a divisional application claiming the benefit of priority of commonly assigned U.S. patent application Ser. No. 12/709,114, filed Feb. 19, 2010, the entire disclosure of which are incorporated herein by reference.

FIELD OF THE INVENTION

This invention generally relates to metal oxide semiconductor field effect transistors (MOSFETs) and more particularly to a termination structure for a superjunction type MOSFET device.

BACKGROUND OF THE INVENTION

Power MOSFETs have typically been developed for applications requiring power switching and power amplification. For power switching applications, the commercially available devices are typically double diffused MOSFETs (DMOSFETs). In a typical transistor, much of the breakdown voltage BV is supported by a drift region, which is lowly doped in order to provide a higher breakdown voltage BV. However, the lowly doped drift region also produces high on-resistance $R_{ds-on}$. For a typical transistor, $R_{ds-on}$ is proportional to $BV^{2.5}$. $R_{ds-on}$ therefore increases dramatically with increase in breakdown voltage BV for a conventional transistor.

Superjunctions are a well known type of semiconductor device. Superjunction transistors provide a way to achieve low on-resistance ($R_{ds-on}$) while maintaining a high off-state breakdown voltage (BV). Superjunction devices include alternating P-type and N-type doped columns formed in the drift region. In the OFF-state of the MOSFET, the columns completely deplete at relatively low voltage and thus can sustain a high breakdown voltage (the columns deplete laterally, so that the entire p and n columns are depleted). For a superjunction, the on-resistance $R_{ds-on}$ increases in direct proportion to the breakdown voltage BV, which is a much less dramatic increase than in the conventional semiconductor structure. A superjunction device may therefore have significantly lower $R_{ds-on}$ than a conventional MOSFET device for the same high breakdown voltage (BV) (or conversely may have a significantly higher BV than a conventional MOSFET for a given $R_{ds-on}$).

Superjunction devices are described, e.g., in "24 mΩcm² 680 V silicon superjunction MOSFET", Onishi, Y.; Iwamoto, S.; Sato, T.; Nagaoka, T.; Ueno, K.; Fujihira, T., *Proceedings of the 14th International Symposium on Power Semiconductor Devices and ICs*, 2002, pages: 241-244, the entire contents of which are incorporated herein by reference. FIG. 1 is a cross-sectional view of part of an active cell portion of a conventional superjunction device 100. In this example, the active cell portion of the device 100 includes a vertical FET structure (e.g., an N-channel) formed on a suitably doped (e.g., N+) substrate 102, which acts as a drain region with a drain contact 105. A suitably-doped (e.g., N-Epitaxial (epi) or N-drift) layer 104 is located on top of the substrate 102. In this example, the device 100 also includes a P-body region 106, an N+ source region 108, and an N+ polysilicon gate region 112. The device 100 also includes a gate contact (not shown) and a source metal 114. As seen in FIG. 1A, the superjunction structures may include alternating, charge balanced P-type columns 120 and N-type columns 122. These columns completely deplete horizontally at a low voltage and so are able to withstand a high breakdown voltage in the vertical direction. The N-type columns 122 may comprise of the portions of the N-type epitaxial layer 104 that are situated adjacent to the P-type columns 120.

A termination structure for such devices is commonly made of further P columns which are laid out in a pattern that extends toward the edge or street of the die. For convenience, the P-columns 120 that are part of the active cell portion of the device 100 are referred to herein as active cell P-columns and the P-columns that are formed in the termination region are referred to as termination P-columns.

In a superjunction device, charge needs to be balanced everywhere, including the corner and termination regions. In the central portions of the active region, the P columns can be arranged in uniform parallel rows, where it is simple to arrange the charge balance. However at the edges and corners, it is more difficult to achieve charge balance, which would lower the BV in those regions and make the device less robust. It would be desirable to optimize the design for the active cell corner regions and for the termination regions of the superjunction devices to keep the electric field distribution constant and to keep uniform BV in the termination region. Curved termination design is used in the corner region to improve BV by reducing E-field. Typically, a radius corner of about 150-200 mm is applied. However, matching P column layouts to the corner regions in a charge balanced manner is challenging. It is within this context that embodiments of the present invention arise.

BRIEF DESCRIPTION OF THE DRAWINGS

Other objects and advantages of the invention will become apparent upon reading the following detailed description and upon reference to the accompanying drawings in which:

FIG. 2A is a top view of a portion at a corner of a superjunction MOSFET device according to a first embodiment of the present invention.

FIG. 2B is a magnified top view of a sub-portion of the portion at the corner depicted in FIG. 2A.

FIG. 3A is a top view of a portion at a corner of a superjunction MOSFET device according to a second embodiment of the present invention.

FIG. 3B is a magnified top view of a sub-portion of the portion at the corner depicted in FIG. 3A.

DESCRIPTION OF THE SPECIFIC EMBODIMENTS

Figure 1:
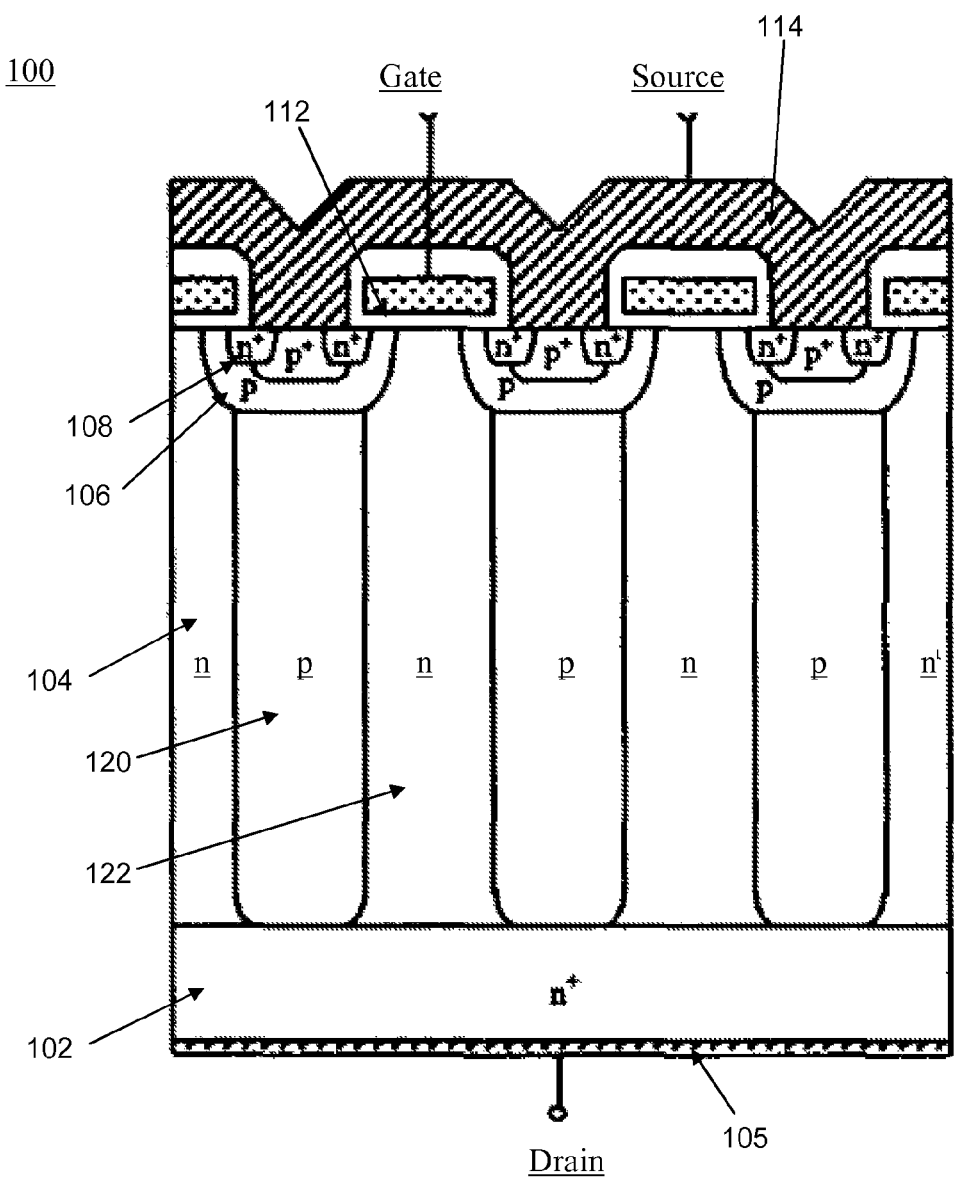
FIG. 1 is a cross-sectional view illustrating a conventional superjunction type MOSFET device.

Although the following detailed description contains many specific details for the purposes of illustration, one of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

A superjunction MOSFET device with a curved corner design and straight ends to the P-columns will often exhibit a low breakdown voltage due to charge imbalance in the corner regions. Prior attempts have been made to balance the charge in the corner region by leaving small holes or P column islands that are not connected in main P column strip. Unfortunately, such solutions can cause problems with unclamped inductive switching (UIS) or might not provide enough a large improvement in BV. In addition, many approaches to charge balancing in corner regions require three-dimensional modeling software. Use of such software can be expensive, complicated to use and time consuming Solution According to an embodiment of the present invention, the end portions of the layout of the active cell P-columns may be adjusted to take into account the curvature at the corners to optimize the charge balance. Charge balance can also be considered in the termination region design.

It is noted that it is possible to make a superjunction device in which the N-type and P-type doping is reversed relative to that described above with respect to FIG. 1. For example, N-columns could be formed in a P-type epitaxial layer to provide charge balance in superjunction device active cells or for termination. To generically refer to both possible types column structures used in superjunction devices the terms first conductivity type and second conductivity type are sometimes used to refer to the different dopant types (i.e., P-type and N-type).

In embodiments of the present invention a simple two-dimensional approach can be used to design the layout of the active cell column structures to ensure proper charge balance at the corners of the termination column structures. One can determine a dose $Q_{imp}$ of first-type dopants to be implanted per unit area in active cell column structures of an active cell region formed in a doped layer (sometimes called an epi layer) of the superjunction device and in termination column structures of a termination region formed in the doped layer and surrounding the active cell region. The doped layer can be characterized by a thickness t and a dopant density M of second conductivity type dopants of an opposite charge type to the first conductivity type dopants. A layout of the active cell column structures can be configured so that a charge due to the first conductivity type dopants balances out charge due to the second conductivity type dopants in the doped layer in the active cell region. A layout of end portions of the active cell column structures proximate the termination column structures can be configured so that a charge due to the first conductivity type dopants in the end portions and a charge due to the first conductivity type dopants in the termination column structures balances out charge due to the second conductivity type dopants in the adjacent doped layer in the corner regions.

Configuring the layout of the end portions of the column structures can include adjusting a configuration of a layout of end portions of active cell column structures proximate a corner of the termination column structures to take into account a curvature of the corner.

The shape of the layout can be adjusted by dividing a portion of the doped layer proximate the corner into one or more regions of area A and laying out the end portions of the active cell column structures such that each of the one or more regions includes an area A1 of termination column and/or active cell column structure such that, for each of the one or more regions, A1/A is a constant. The constant can be equal to $M \cdot t / Q_{imp}$ as will be further explained below.

There are a number of different possible ways for adjusting the layout of the end portions of the active cell column structures proximate the corner. For example, the layout of each end portion could include a hooked portion. Alternatively, a distance between one or more of the end portions and a nearby termination column structure could be adjusted to provide the desired charge balance in the corner regions. Furthermore, in some embodiments, the layout of the end portions can include an edge ring portion connecting the end portions of two or more adjacent active cell column structures.

Examples of embodiments of the present invention are described in further detail below.

DETAILED DESCRIPTION

FIG. 2A is a top view of a portion 200 at a corner of a superjunction MOSFET device including both the active region 251 and a surrounding termination region 252 configured according to an embodiment of the present invention. FIG. 2B is a magnified top view of a sub-portion 202 of the portion 200 depicted in FIG. 2A, which, for convenience, only shows two adjacent active cell P-columns 204 and 206 in the active region 251. The active cell P-columns 204, 206 can be characterized by a width W and a pitch H. The active cell P-columns can be part of superjunction devices configured as shown in FIG. 1. End portions 210 of the active cell P-columns are located proximate a first termination P-column 208. The first termination column 208 can also be referred to as an ending ring, and is at the source potential. Subsequent termination P-columns 209 can serve as floating guard rings for spreading the voltage across the termination region. In this example, the active cell P-columns 204, 206 and termination P-columns 208 can be formed by implantation of suitable P-type dopants into an N-type layer, e.g., an N-epitaxial layer 203. The dose $Q_{imp}$ (in dopants per unit area) of the implanted P-type dopant in the active cell P-columns 204, 206 and the termination P-columns 208 and 209 can be made uniform so that the implantation for both the active cell columns and the termination columns can take place during the same implantation process, using the same masks.

Although in this example, P-type dopants are implanted in an N-type layer 203 to form active cell P-columns 204, 206 and termination P-columns 208 and 209, those skilled in the art will recognize that alternatively, N-type dopants could be implanted in a P-type epi layer to form active cell and termination column structures.

As noted above, the layout of the end portions 210 of the active cell column structures proximate the termination column structures can be configured so that a charge due to the P-type dopants in the end portions 210 and the nearby termination P-column 208 balances out charge due to N-type dopants in the surrounding portions of the N-type layer 203.

In the particular example depicted in FIGS. 2A-2B, the end portions are curved portions 210 to account for the radius of curvature of the ending ring P-columns 208 in a corner region.

The shape and size of the curved end portions 210 can be calculated by calculating an area ratio to balance the charges in the corner regions. Specifically, the charge $C_P$ due to P-type dopants should equal the charge $C_N$ due to N-type dopants. The device layout may be divided into portions that include P-type doped regions and regions that are not P-type doped. The regions that are not P-type doped are essentially N-type columns. It is noted that since the P-type dopants are implanted into an N-type doped layer 203, each portion contains N-type dopants, and are initially N-type. However in the area that are later implanted with P-type dopants, enough P-type dopants are implanted to overcome the initial N-type dopants to make that area P-type. For each portion the charges due to P-type and N-type dopants should balance, i.e.:

$$C_P = C_N \quad (1)$$

For each portion, the total charge $C_P$ due to P-type dopants may be determined from a dose $Q_{imp}$ of dopants implanted per unit area (top area) to form the P-columns 204, 206, 208 and an area A1 of the portion into which P-type dopants are implanted.

$$C_P = Q_{imp} \cdot A1 \quad (2)$$

The charge $C_N$ due to N-type dopants may be determined from the dopant density M of N-type dopants per unit volume in the N-type layer 203, a thickness t of the N-type layer (and P-type column) and a total area A of the portion. $C_N$ includes all the N type charges, including those in the P doped area A1. The total area A includes the both the P-type area A1 and a non-P-type-doped area $A_N$ of the portion. Thus, $A=A1+A_N$ and $$C_N = M \cdot t \cdot A \quad (3)$$

Substituting equations (2) and (3) into equation (1) yields:

$$Q_{imp} \cdot A1 = M \cdot t \cdot A \quad (4)$$

The dose $Q_{imp}$, the dopant density M, and thickness t can be determined based on other considerations of the device. Assuming these three quantities are fixed, equation (4) can be rewritten as:

$$\frac{A1}{A} = \frac{M \cdot t}{Q_{imp}} \quad (5)$$

As long as the ratio of P-type doped areas A1 to the total area A is held constant according to equation (5), the P-type regions and the N-type regions are charge balanced. Therefore, the problem of configuring the layout of the end portions 210 proximate the corners of the termination P-columns 208 can be reduced to a simple 2-dimensional problem.

Figure 2C:
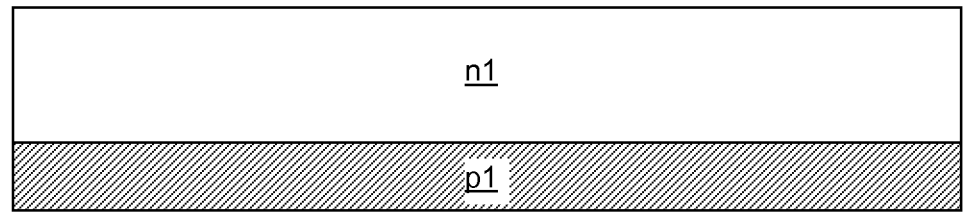
FIGS. 2C-2E are top views of three divided regions n1/p1, n2/p2 and n3/p3 respectively of FIG. 2B.
Figure 2D:
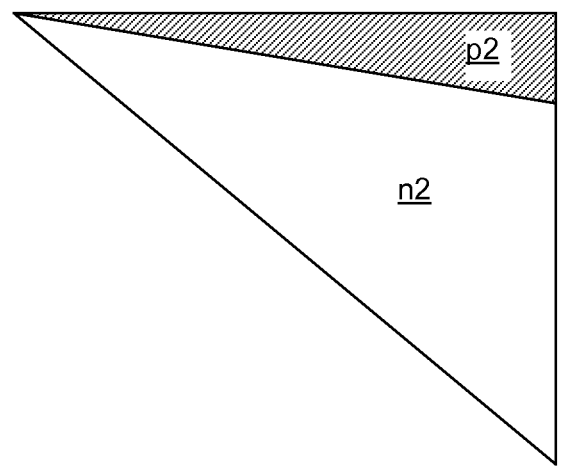
Figure 2E:
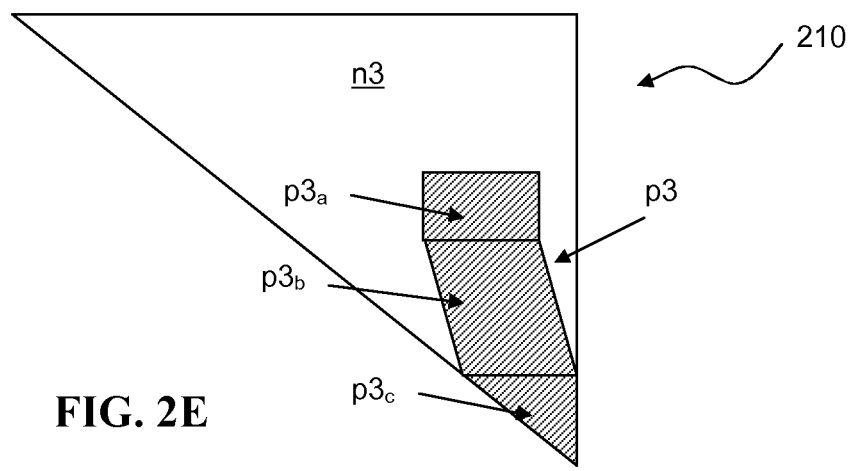

For example, as shown in FIG. 2B, the layout of the end portions 210, the nearby N-doped layer and the proximate portion of the termination columns 208 can be divided into areas, which include P-doped portions having areas designated p1, p2, and p3 and corresponding non-P-type-doped portions having areas designated n1, n2, and n3. Regions n1 and p1 are shown in FIG. 2C. The regions p1 and n1 can have a slight curvature to them, but are illustrated as rectangles here for simplicity. Similarly, the hypotenuse of the 'triangles' of n2 and n3 may also have a slight corresponding curve to them. Regions n2 and p2, are shown in FIG. 2D and regions n3 and p3 area are shown in FIG. 2E.

In the example depicted in FIGS. 2A-2E, the shapes of the regions are selected to give the end portions 210 a hooked shape near the corner of the termination columns 208.

Charge can be balanced in the corner region by setting the areas of the regions p1, n1, p2, n2 p3, n3 such that $$\frac{p1}{p1+n1} = \frac{p2}{p2+n2} = \frac{p3}{p3+n3} = \frac{M \cdot t}{Q_{imp}} \quad (6)$$

There can be some flexibility in determining the shapes of the regions p1, n1, p2, n2, p3 and n3. The sizes, shapes and location of the implanted areas p1, p2 and p3 can be determined using the result from equation (6).

It should be noted that most parts of the active cell P-type columns such as 204 and 206 are straight and run parallel to one another across the die. For these straight and parallel portions, charge balance can be easily obtained by adjusting the width W of the P-type columns and the pitch H between adjacent P-type columns. These values are chosen according to equation (5) such along these straight portions, half of each P-type column is charge balanced with the adjacent N-type regions:

$$\frac{W/2}{H/2} = \frac{W}{H} = \frac{M \cdot t}{Q_{imp}} \quad (7)$$

However, in the corner regions it becomes difficult to maintain charge balance, which is the reason for embodiments of this invention.

FIGS. 2A through 2E illustrate only one possible example amongst many others for a selection of the shape of p2 and p3 areas. The shapes of p3 and n3 include a hook to the end portions 210. The shapes of the p1 and n1 areas can round the end portions 210 before the hook shaped portion and the shapes of p2 and n2 can be configured to remove a wedge from the end portions 210 on the opposite side of the hook shape—in order to achieve charge balance according to equation (6). The hook bends towards the side closest to the center of the die. For example, as shown in FIGS. 2A and 2B—in the illustrated corner of the die—the hook bends in a clockwise direction. As seen in FIG. 2E, the area p3 can be calculated as a combination of three areas $p3_a$, $p3_b$ and $p3_c$ that are suitable for an implantation in a lithographical process limited only by a critical dimension (CD).

With suitably configured end portions of the active cell P-columns, the breakdown voltage (BV) at the corner regions can match the BV in the central portions, thus improving the robustness and reliability of the device.

In another embodiment, to balance the charge and to increase the BV voltage at the corner of the active region, a P type edge ring 304 can be formed at the end of the active cell P-columns that connects the end portions of two or more adjacent active cell P-columns. FIG. 3A is top view of a portion of a layout 300 at a corner of a superjunction MOSFET device. As shown in FIG. 3A, the edge ring 304 can be formed at the end of the P-columns 310 and proximate to an ending ring 306 that includes termination P-columns. The ending ring 306 is at source potential, just like the edge ring 304 and P-column 310. Termination floating guard rings 307 can be located outside of the ending ring 306 to spread out the electric field. A field plate (not shown) can be formed in the termination over the P-columns of the floating guard ring 307, e.g., by patterned deposition of metal, e.g., aluminum. The edge ring 304, ending ring 306 and floating guard rings 307 can be formed as part of the implantation step that forms the active cell P-columns 310.

FIG. 3B is a magnified top view of a sub-portion 302 of the portion 300. The charge balancing in the region between the edge ring 304 and the ending ring 306 and in the region between the end portions of the active cell P-columns 310 and the edge ring 304 can be achieved using the same method as described above in FIGS. 2A-2B. By way of example and not by way of limitation, the BV of this corner region can be 600V. Specifically, the end portions of the active cell P-columns 310, portions of the edge ring 304 and nearby N-doped layer can be divided into areas that include P-doped portions and corresponding non-P-type-doped portions. The configuration of the P-doped portions can be adjusted to satisfy equation (5) or an equation like equation (6) so that the charges are balanced. A similar process may be used to balance charge in the region between the edge ring 304 and the ending ring 306. To simplify this process, the curvature radii of the edge ring 304 and ending ring 306 may be selected so that there is a fixed spacing between them in the corner region. As in FIGS. 2A-2E, the end regions may be broken up into smaller areas where p-type doped area p4 (comprising $p4_a$ and $p4_b$) and non-p-type doped area n4 are charge balanced, p-type doped area p5 and non-p-type doped area n5 are charge balanced, and p-type doped area p6 and non-p-type doped area n6 are charge balanced. Based on equation (5), the appropriate area ratios are:

$$\frac{p4}{p4+n4} = \frac{p5}{p5+n5} = \frac{p6}{p6+n6} = \frac{M \cdot t}{Q_{imp}} \qquad (8)$$

Certain features can help these regions achieve the appropriate area ratio for charge balance. For example, at the intersection of the edge ring 304 and the end portions of active cell P-columns 310 in the corner regions form an acute angle on one side and an oblique angle on the other side. On the side of the intersection forming the acute angle, there is too much area with P columns. So, a notch is removed from the end portion of the active cell P-column 310 from the acute angle side. The edge ring 304 is also made less wide in the areas near an acute angle formed than in the areas near an oblique angle. These features can be seen in the areas n5, p5, n6 and p6.

Figure 4:
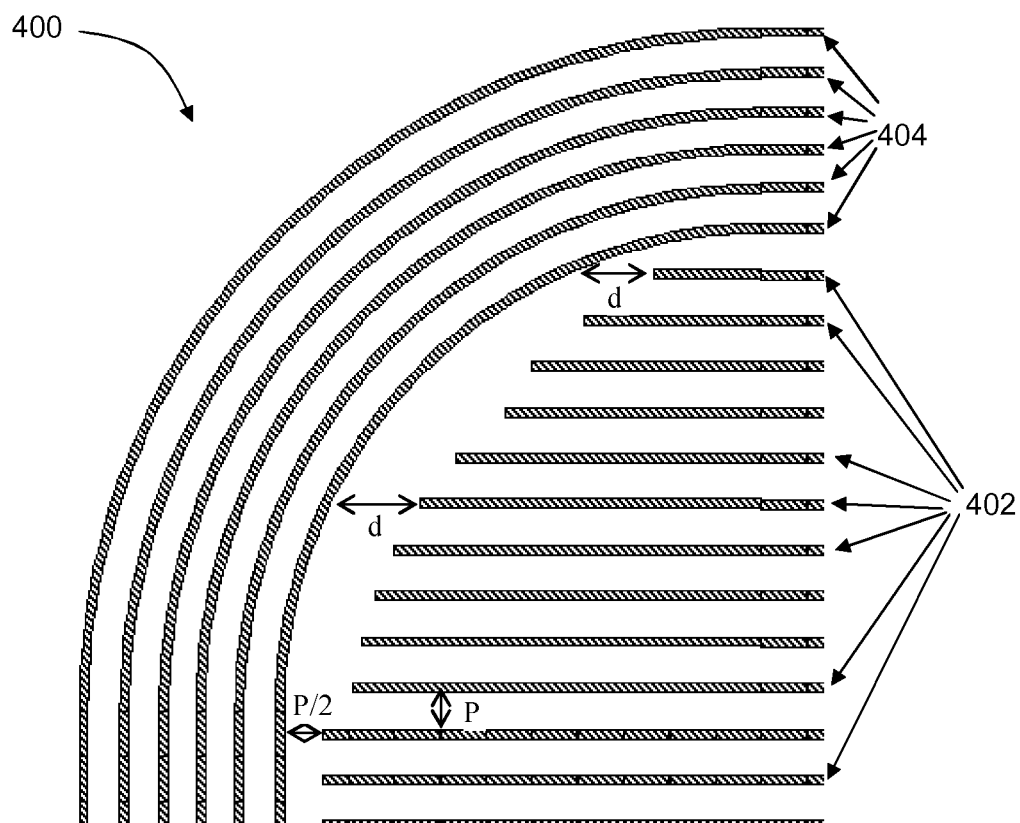
FIG. 4 is a top view of a portion at a corner of a superjunction MOSFET device according to a third embodiment of the present invention.

FIG. 4 is a top view of a portion 400 at the corner of a superjunction MOSFET device according to another embodiment of the present invention. As shown in FIG. 4, a distance d from the end of the active cell P-columns 402 and the termination columns 404 can be adjusted to obtain charge balance in the corner region. In this example, there are ten (10) active cell P-columns 402 in the cell region for which the distance d needs to be adjusted in order to obtain charge balance. At the sides of the active cell region, away from the corners, the nearby portion of the termination columns 404 is not curved. Consequently the distance d can be fixed here, e.g., at about half of the pitch H between two adjacent P columns 402.

According to embodiments of the present invention, the layout of the active cell column structures (including the end portions) can be transferred to a pattern of implant of first conductivity type dopants (e.g. p-type) into the doped layer, e.g. epi layer of second conductivity type (e.g. n-type). By way of example, and not by way of limitation, the layouts shown in any of FIG. 2A-2B, 3A-3B or 4 could be used as the basis for an implant mask, which could be manufactured by conventional means. Ions could then be implanted through the mask. Alternatively, the layouts shown in any of FIG. 2A-2B, 3A-3B or 4 could be used as a basis for maskless implant using a steered beam implant system. The remainder of the superjunction device fabrication may proceed in an entirely conventional fashion. Consequently, embodiments of the present invention may readily improve existing superjunction device fabrication methods and facilities at relatively low expense and rapid turnaround time. Only the corners of the layouts need be modified.

There are a number of different possible termination structures that can be used in embodiments of the present invention. By way of example, and not by way of limitation, three possible termination structures 500, 530 and 540 for the superjunction devices are shown in FIGS. 5A-5C.

Figure 5A:
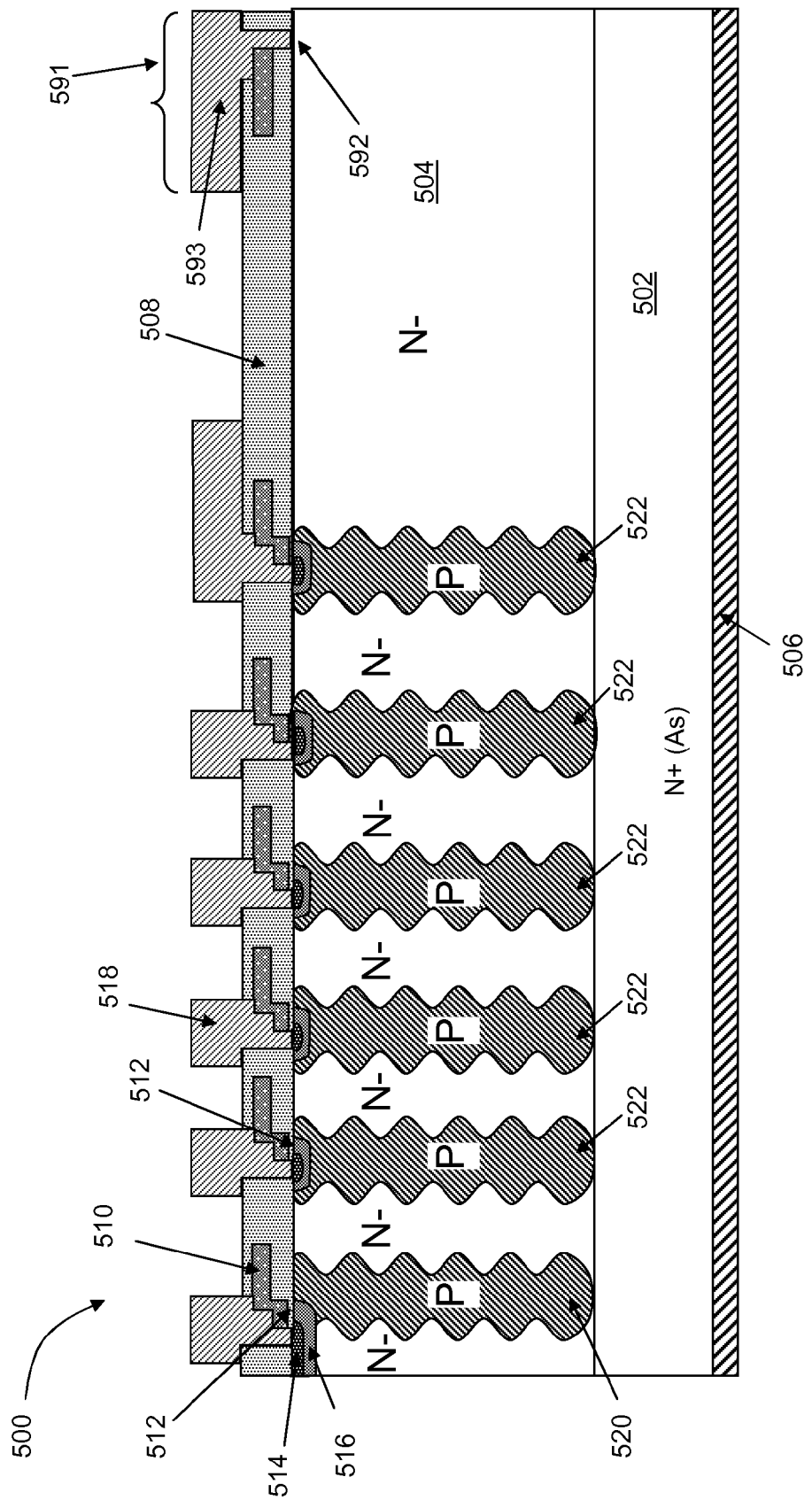
FIGS. 5A-5C are cross-sectional views of structures for a termination region in a superjunction MOSFET device according to an embodiment of the present invention.

As shown in FIG. 5A, the termination structure 500 includes an N+ substrate 502, which acts as a drain region with a drain metal 506. An N-Epitaxial (epi) or N-drift layer 504 is located on top of the substrate 502, and a field plate 510 positioned on top of a thin oxide 512. The field plate may be made of a suitable electrically conductive material, such as N+ polysilicon. The cross-section of the field plate 510 may be characterized by two-step shape, including a gate oxide portion 512 as shown in FIG. 5A. The termination structure 500 also includes a metal short 518 and a field oxide 508 for electrically isolating the metal short 518 and the field plate 510. The metal short 518 connects the field plate 510 to the P+ body contact 514 and may include a metal, such as Aluminum. The field oxide 508 may be formed with phosphosilicate glass (PSG) with low thermal oxidation. As seen in FIG. 5A, the termination structures may include an inside P column 520 proximate to the cell region, e.g. ending ring 208 in FIG. 2B or ending ring 306 of FIG. 3B (which can be connected to the source potential, e.g., ground or zero potential), and five floating guard ring P columns 522 and N-type columns that may comprise of the portions of the N-type epitaxial layer 504 that are situated adjacent to the P-type columns 520, 522. The P columns 520, 522 include a P+ contact region 514 located in a P-body region 516. Next to the die edge, a channel stop field plate 591 is connected to the semiconductor substrate with a Schottky style channel stop 592. The metal portion 593 of the channel stop field plate contacts the N-drift layer 504 of the semiconductor substrate without an N+ implant or P body implant, thus forming a Schottky style channel stop 592 there. This enables a functional channel stop to be formed without using any additional masks (e.g., blocking a body implant or performing N+ implant).

Figure 5B:
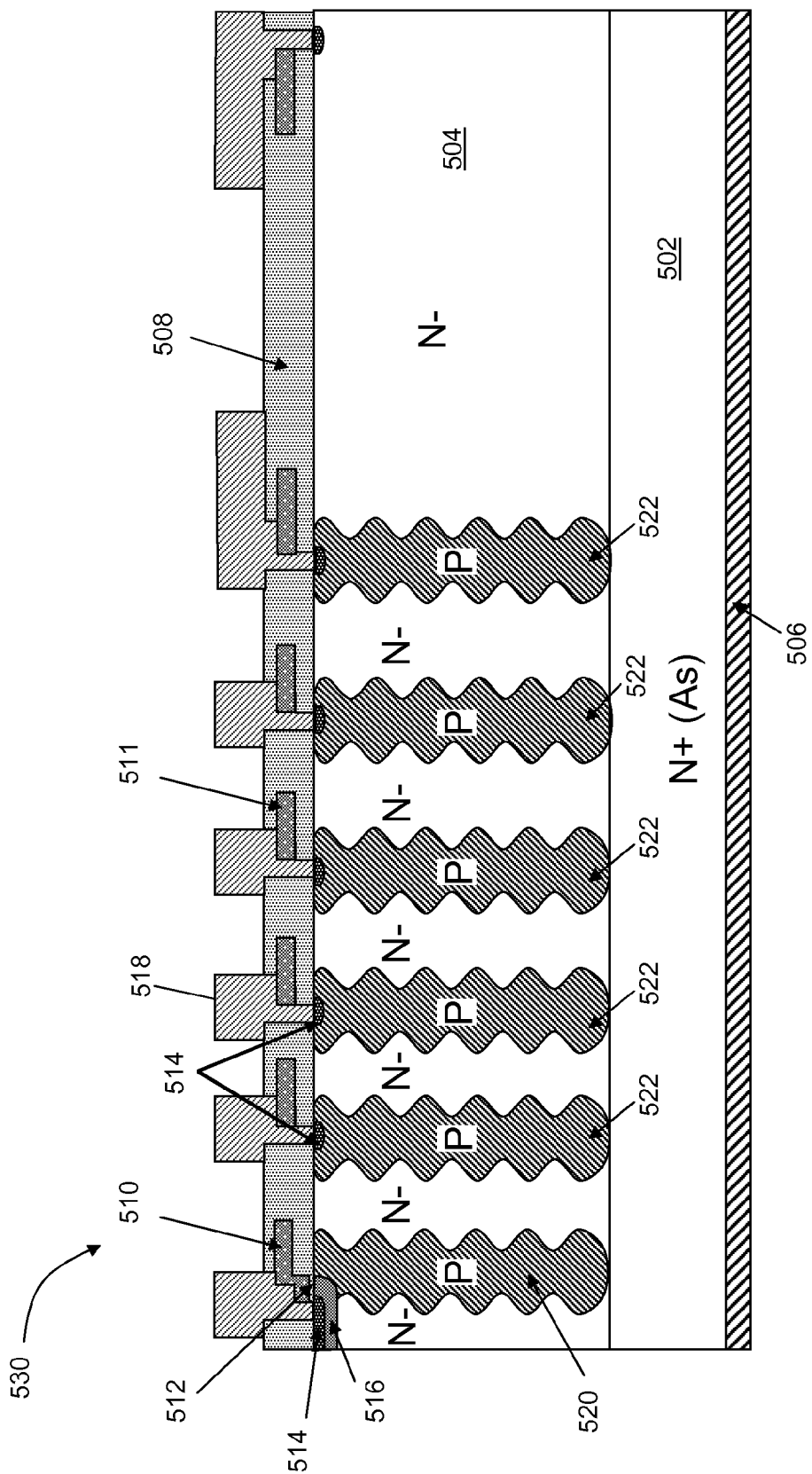

The termination structure 530 of FIG. 5B has a similar design as the termination structure 500, except the P columns 522 do not include a P body region 516. Also, the field plates 511 do not have a gate oxide portion 512 like the field plates 510 of FIG. 5A.

Figure 5C:
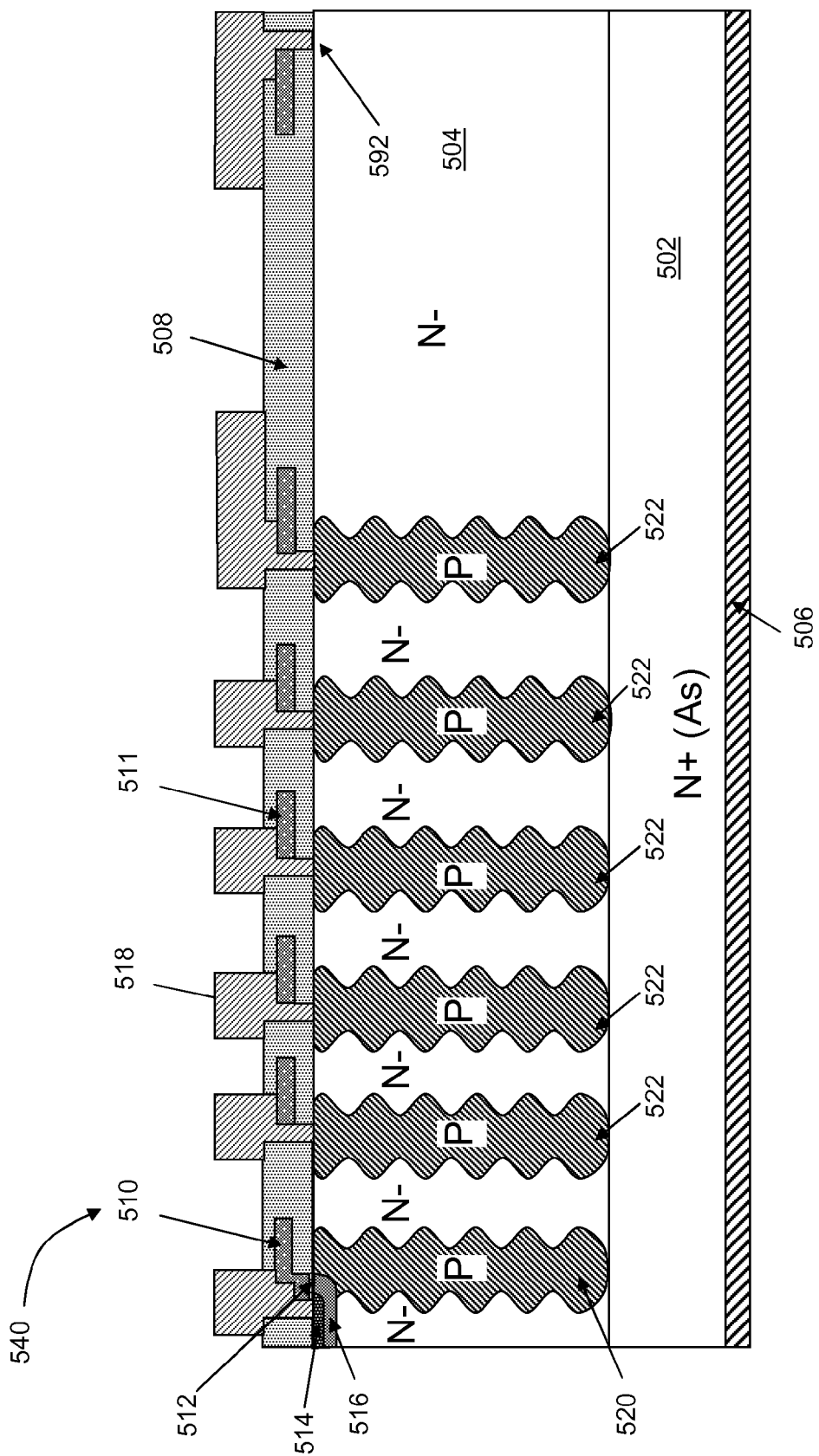

As shown in FIG. 5C, the termination structure 540 has a similar design as the termination structure 500, except the P columns 522 do not include a P+ contact region 514 and a P body region 516.

While the above is a complete description of the preferred embodiment of the present invention, it is possible to use various alternatives, modifications and equivalents. For example, though MOSFET superjunction devices are mentioned, this invention can also apply to other superjunction devices. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A termination structure for a semiconductor device, comprising:
a channel stop field plate on a surface of a semiconductor material proximate an edge of the semiconductor material, wherein the channel stop field plate includes a metal portion and an isolation portion, wherein the metal portion of the channel stop field plate contacts the semiconductor material without a heavily doped implant region or a body region and thereby forming a Schottky style channel stop, and wherein the channel stop field plate is electrically isolated by the isolation portion from areas of the semiconductor device other than where the Schottky style channel stop is formed.

2. The termination structure of the claim 1 wherein the metal portion of the channel stop field plate contacts a lowly doped portion of the semiconductor material.

3. The termination structure of claim 1 wherein the termination structure is formed on a die containing a semiconductor device, wherein the semiconductor device is a MOSFET.

4. The termination structure of claim 1 wherein the termination structure is formed on a die containing a semiconductor device, wherein the semiconductor device is a superjunction device that includes alternating charge balanced first doped columns of first conductivity type and second doped columns of second conductivity type in an active cell region.

* * * * *